US007427937B2

(12) United States Patent
Draxelmayr

(10) Patent No.: US 7,427,937 B2
(45) Date of Patent: Sep. 23, 2008

(54) MULTI-CHANNEL DIGITAL/ANALOG CONVERTER ARRANGEMENT

(75) Inventor: Dieter Draxelmayr, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/477,575

(22) Filed: Jun. 29, 2006

(65) Prior Publication Data

US 2007/0001888 A1 Jan. 4, 2007

(30) Foreign Application Priority Data

Jun. 30, 2005 (DE) ....................... 10 2005 030 563

(51) Int. Cl.
*H03M 1/66* (2006.01)

(52) U.S. Cl. ....................................... 341/144; 341/141

(58) Field of Classification Search ................. 341/144, 341/141, 122; 370/535, 537
See application file for complete search history.

(56) References Cited

U.S. PATENT DOCUMENTS

| | | | | |
|---|---|---|---|---|
| 3,372,237 | A * | 3/1968 | Hackett | 370/535 |
| 4,593,390 | A | 6/1986 | Hildebrand et al. | 370/541 |
| H0967 | H * | 9/1991 | Mariotti | 370/537 |
| 5,155,488 | A | 10/1992 | Takahashi | 341/144 |
| 5,293,166 | A | 3/1994 | Ta | 341/118 |
| 6,141,389 | A * | 10/2000 | McCallister et al. | 375/295 |
| 6,169,505 | B1 * | 1/2001 | Nishimura et al. | 341/141 |
| 6,473,416 | B1 | 10/2002 | Lee | |
| 6,621,437 | B2 | 9/2003 | Khalil et al. | |
| 2004/0128008 | A1 * | 7/2004 | Lee et al. | 700/94 |

FOREIGN PATENT DOCUMENTS

| | | |
|---|---|---|
| DE | 196 44 772 C2 | 5/1998 |
| DE | 100 38 372 C2 | 3/2002 |
| KR | CN 1254997 | 5/2000 |
| WO | WO 01/05036 | 1/2001 |

OTHER PUBLICATIONS

German Office Action dated Mar. 15, 2006.
Chinese Office Action (English translation) dated Apr. 4, 2008.
German Office Action dated Jun. 26, 2008.

* cited by examiner

*Primary Examiner*—Peguy JeanPierre
(74) *Attorney, Agent, or Firm*—Jenkins, Wilson, Taylor & Hunt, P.A.

(57) ABSTRACT

A multi-channel digital/analog converter arrangement comprises at least two data channels for receiving and forwarding a corresponding number of digital data input signals comprising respective time characteristics, a digital multiplexer generating a digital intermediate signal present at a common node by combining the at least two digital data input signals, and a digital/analog converter connected downstream of the multiplexer for converting the digital intermediate signal into an analog output signal. The multiplexer comprises a tuning device for tuning the time characteristics of the at least two digital data input signals in respect to each other.

14 Claims, 2 Drawing Sheets

VDD
47
53
52
25
Din'
Dz'
45
49
50
Dz
46
51
24
Din
48
RESISTANCE NETWORK
READ-OUT SWITCHING DEVICE
C3
44
40
42
39
41
43
D1
D1'
GND
33
32
31
SYNCHRONIZATION DEVICE
17a
17b
38
37
READ-IN SWITCHING DEVICE
C1
36
34
35
30
14
Din1
17
C4
C2
D2
D2'
15
Din2
18

MULTI-CHANNEL DIGITAL/ANALOG CONVERTER ARRANGEMENT

BACKGROUND OF THE INVENTION

The invention relates to a multi-channel digital/analog converter arrangement.

A digital/analog converter, for short also called D/A converter in the text which follows, is designed for converting a digital, for example a binary input signal into an analog output signal, for example an output voltage or an output current. Regarding the general background of D/A converters, reference is made to U.S. Pat. Nos. 6,346,901 B1, 4,712,091 and 5,293,166.

D/A converters are mainly used in digital signal processing. Applications for digital signal processing are, for example computer- and software-based applications, for example in a microprocessor, or telecommunication applications, for example broadband applications or mobile radio applications. In modern systems of digital signal processing there is an increasing requirement for processing greater and greater volumes of data in shorter and shorter time. With the advancing development in the field of integrated circuits and the further development of modern communication systems, the capability of these systems for processing data at high data rate also increases. Modern data communication systems are operated, for example, at an operating frequency of about 4 GHz and more. To provide effective data processing, however, it is very essential to forward the processed data, and to convert them into analog output signals, at corresponding speed.

To implement these very high-quality systems of digital signal processing, D/A converters are therefore increasingly used which provide high-bit-rate digital/analog conversion with a very high sampling rate and the best possible analog characteristics, if possible. The quality and accuracy of the D/A conversion plays a decisive role in this context. In the text which follows, such D/A converters will be called high-speed D/A converters.

The digital data to be converted into an analog output signal by the high-speed D/A converter come from a data source, for example from a memory chip, a logic circuit, a microprocessor or the like. To be able to process the large volumes of data to be processed, a number of data sources are frequently used. In this arrangement, the data are read out of the various data sources in parallel and supplied to a corresponding processing device for conversion into an analog output signal. One of these data sources and the corresponding downstream data path in each case define one data channel, the different data channels being arranged in parallel with one another. The corresponding D/A converter will be called a multi-channel D/A converter in the text which follows. To combine the various data channels, a multiplexer device is provided which generates from the data of the various data channels a single digital data stream which is then supplied to the downstream digital/analog converter. When the data speed is very high, very high demands are made on the multiplexing of the data of the various data channels.

In published Japanese application for patents 01099323 and 04016024, digital/analog converter circuits are in each case described in which the data of a number of parallel data channels are coupled into a corresponding combining circuit such as, for example, a multiplexer and are output as serial digital data stream which is then supplied to the digital/analog converter. Although the use of a number of parallel data channels which in each case have a comparatively low data rate allows the data processing to be arranged in a simpler manner there, the problem still exists that, in particular, in the multiplexer and on the data path between the multiplexer and the digital input of the downstream digital/analog converter, the data present there has a very high data rate and thus also has to be processed further with a correspondingly high speed. A high data processing speed in these elements is, therefore, associated with a correspondingly high power consumption. At very high data processing speeds, signal conditioning must also be performed following the multiplexer, in which so-called retiming is performed. In this process, the switching edges of the data signal combined by multiplexing are adjusted to the corresponding requirements of the current switches of the downstream digital/analog converter. At very high data rates, in particular or at very high volumes of data to be processed, respectively, it is also no longer possible in many applications to combine these volumes of data in the multiplexer.

A further possibility for processing a large volume of data is the provision of a number of parallel digital/analog converters which are in each case allocated to one data channel. This multiplicity of digital/analog converters is designed for converting the data of an in each case associated data channel into an analog signal so that a number of analog output signals corresponding to the multiplicity of digital/analog converters is present. These output signals can then be combined into a single analog signal in an analog multiplexer provided especially for this purpose. Such an arrangement which thus has a number of digital/analog converters and an analog multiplexer is described, for example, in the article by M. Clara et al.: "A 350 MHz low-OSR SD Current-Steering DAC with Active Termination in 0.13 μm CMOS", ISSCC 2005, pages 118-119, particularly in FIG. 1. The disadvantage of the arrangement described there consists in that a multiplicity of individual digital/analog converters must be provided for the D/A conversion which entails considerable circuit expenditure, particularly if there are many data channels.

BRIEF SUMMARY OF THE INVENTION

A multi-channel digital/analog converter arrangement for converting a number of digital input data signals into an analog output signal is provided, comprising at least two data channels for receiving and forwarding a corresponding number of digital data input signals, with a digital multiplexer which combines the at least two digital data input signals forwarded in the data channels at a common node arranged at the output end to form a digital intermediate signal, the multiplexer comprising a tuning device by means of which the time characteristic of the at least two digital data input signals forwarded in the data channels can be tuned to one another and with a digital/analog converter downstream of the multiplexer, which converts the combined digital intermediate signal into the analog output signal.

The present invention is based on a digital/analog converter in which a number of data channels are combined by means of a single digital high-speed multiplexer to generate a single serial digital data stream which is subsequently processed further in the actual digital/analog converter. The invention is based on the finding that the treatment and processing of a very large volume of data on a single data path is extremely difficult and very frequently entails problems in the corresponding processing devices such as, for example, a multiplexer or a digital/analog converter. A further finding consists in that, by comparison, the treatment and processing of the data on different data paths, instead, is uncritical since there the data are present at a significantly reduced data rate and/or volume of data depending on how many data paths there are and what quantity of data are to be processed, which generally makes lower demands on the corresponding processing devices.

The concept of the present invention consists in separating the data paths with the reduced data rate or the reduced volume of data from one another as long as possible. This separation also involves the data channels being separated from one another as long as possible also within the high-speed multiplexer preceding a digital/analog converter and only being combined immediately preceding the data output of the multiplexer and thus immediately preceding the current or voltage switches at the input of the downstream digital/analog converter. In this manner, the processing steps which are critical with regard to a high data rate are reduced to a minimum.

Retiming of the digital data signals, which only takes place following the multiplexer in known solutions, is performed by the multiplexer itself. The retiming, which provides for synchronization and thus adjusting the data signals to one another is here performed before the actual combining of these data signals. In the actual combining (multiplexing), the data signals of the various data channels are thus already present in synchronized form aligned to one another. This only requires a simple latch and a tuning circuit following the latch which performs retiming by adding the data signals on the various data channels at a common node at the output.

The combined data signals generated at the output by the high-speed multiplexer which thus have a high data rate, are directly coupled into the downstream digital/analog converter. There is no processing or treatment of these digital data at high data rate of whatever form (e.g. in the form of retiming) between the high-speed multiplexer and the digital/analog converter, or it is reduced to a minimum, at least.

This processing or treatment of data signals at a very high data rate represents an extremely high expenditure for the corresponding processing device. With increasing data rate, in particular, there is an also increasing risk that the corresponding data signals can be corrupted with regard to their signal form which, in total, can lead to an unambiguous correlation of a data signal with a logical level (logical zero (LOW, "0") or logical one (HIGH, "1")) is no longer possible, or only with difficulty. This risk is reduced by the present invention since the serial digital data stream to be processed, which has a very high data rate, is subjected to a minimum of components which, in total, significantly reduces the above risk of a data loss.

In one embodiment of the inventive D/A-converter, the tuning device, which is used for retiming the data input signals on the various data channels, has a synchronization device by means of which the digital data input signals of the various data channels can be synchronized to one another as precisely as possible by means of the clock-synchronous control signal. For this purpose, the synchronization device preferably has a simple latch.

The tuning device may have at its output a controllable output switching device which follows the latch or the synchronization device, respectively, and which is used for the clock-synchronous reading of the data input signals out of the latch or the synchronization device, respectively. Preferably, a controllable input switching device may also provided which precedes the latch or the synchronization device, respectively, at the input and which is used for the clock-controlled reading of the data input signals into the latch or the synchronization device, respectively.

The input switching device and/or the output switching device in each case may have at least one controllable switch per data channel, the controlled paths of which are arranged on a data path of one of the data channels and which can be activated in each case via a control signal. The control signals for activating the controllable switches of the input switching device and the control signals for activating the controllable switches of the output switching device may be clock-synchronous to one another. To provide the clock-synchronous control signals, an activating circuit especially provided for this purpose may preferably be provided. The controllable switches can be constructed, for example, as MOSFET or JFET transistors which are particularly suitable for fast switching.

In one embodiment of the inventive D/A-converter, which is also very suitable since it is very interference-proof, the multiplexer and/or the downstream digital/analog converter are constructed to be fully differential.

In a further embodiment of the inventive D/A-converter, a device for level conversion is provided which is arranged between the output of the multiplexer and the common node and which is designed for specifying predetermined logic levels of the intermediate signal. In this manner, the various logic level or levels of the output signal can be selectively defined and, in particular, selectively adapted to the downstream circuit arrangement. Since the output of the multiplexer is typically connected directly to corresponding current or voltage switches of the downstream digital/analog converter which have a corresponding switching level, the level or levels of the combined digital intermediate signals can be selectively placed in these switching levels, and thus the operating point of the current or voltage switches, by means of the device for level conversion. The device for level conversion can be constructed, for example, as a simple resistance network.

The digital/analog converter has in a known manner current switches at the input end for switching the current sources at the input end. The current sources are used for generating the analog output signal from the combined digital intermediate signal. According to the invention, in distinction from known solutions, the current switches are connected directly to the output of the preceding multiplexer at the control end. It would also be conceivable if the digital/analog converter has at its input end voltage switches for generating the analog output signal. In this context, direct means that no further tuning circuit for tuning or retiming the signal form of the combined digital intermediate signal is provided between the digital multiplexer and the downstream digital/analog converter. However, it would be conceivable that a drive circuit is provided there for example which amplifies the combined intermediate signal, for example if the signal deviation of the combined intermediate signal, provided by the multiplexer or its output device for level conversion is inadequate for activating the downstream current or voltage switches.

DETAILED DESCRIPTION OF THE INVENTION

Figure 1:
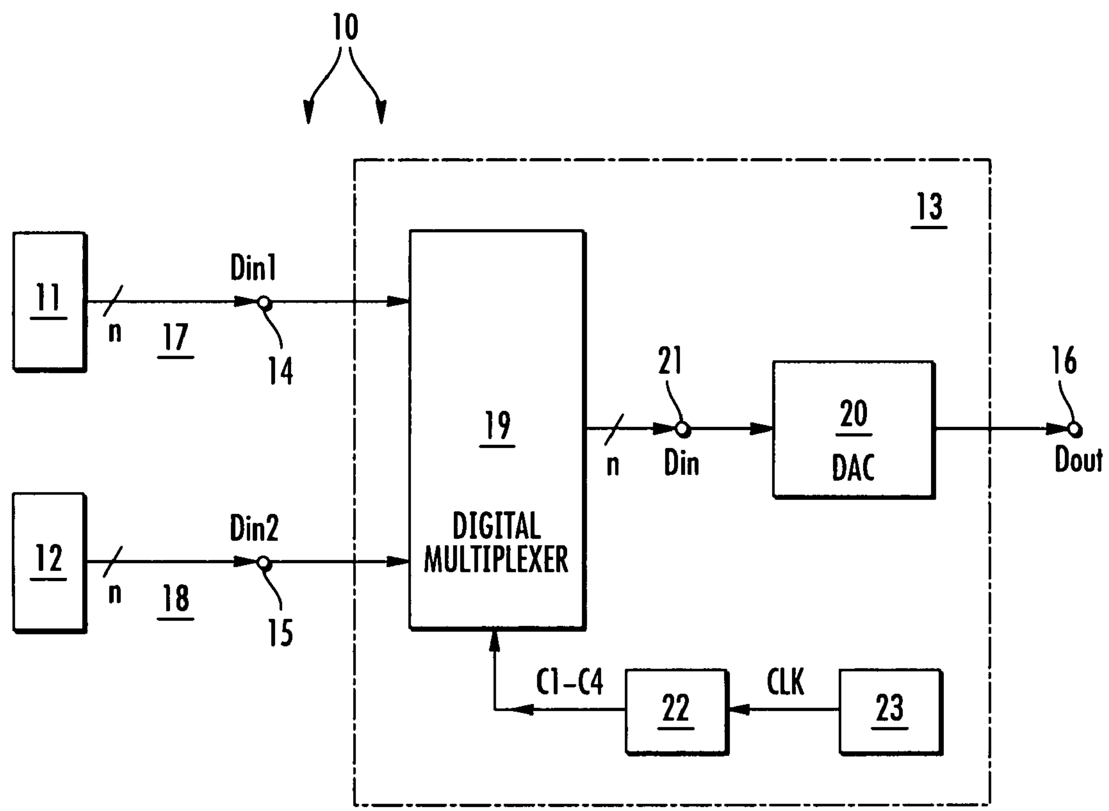
FIG. 1 is a block diagram for representing a system with an exemplary embodiment of an inventive digital/analog converter arrangement.

In all figures of the drawing, identical and functionally identical elements, features and signals have been provided with the same reference symbols unless otherwise specified.

FIG. 1 shows a general system with a digital/analog converter arrangement according to the invention by means of a block diagram. The system in FIG. 1, which is there designated by the reference symbol 10, can be, for example, any communication system or any computer- or software-based system. In the present exemplary embodiment, the system 10 contains two data sources 11, 12 and an n-bit digital/analog converter arrangement 13 according to the invention. The digital/analog converter arrangement 13 has two data inputs 14, 15 and a data output 16. One of the data sources 11, 12 in each case is connected to one of the data inputs 14, 15.

Each of the data sources 11, 12 is designed for providing at its output end digital data signals Din1, Din2 of bit width n which can be coupled into the downstream digital/analog converter arrangement 13 via one of the data inputs 14, 15 in each case. These digital data signals Din1, Din2 are, for example, serial data streams onto which the digital data to be converted are coded in binary form or in thermometer code.

The data sources 11, 12 can be constructed in any manner, for example as conventional memories such as, for example, as DRAM memories, as SRAM memory or the like. It is particularly advantageous if the two data sources 11, 12 are, for example, part of a so-called DDR DRAM semiconductor memory which is designed for providing twice the data rate at its output end. Naturally, it would also be conceivable that the data sources 11, 12 are part of a logic circuit which provide the corresponding digital data signals Din1, Din2 at the output end. It would also be conceivable that the data sources 11, 12 are part of a program-controlled device such as a microprocessor or microcontroller, or a hard-wired logic circuit which has, for example, a PLD or FPGA.

The digital data streams Din1, Din2 coupled into the digital/analog converter arrangement 13 via the data inputs 14, 15 from the respective data sources 11, 12 define a respective data channel 17, 18. In the exemplary embodiment in FIG. 1, two data channels 17, 18 of bit width n are provided which are arranged in parallel with one another. One channel in each case has a number of data paths corresponding to the bit width n which is correspondingly indicated in FIG. 1.

The digital/analog converter arrangement 13 comprises a digitally arranged multiplexer 19 and a digital/analog converter 20 following the multiplexer 19. The digital multiplexer 19 is connected at its input to the data inputs 14, 15 so that the multiplexer 19 is supplied with the digital data streams Din1, Din2 via the two data channels 17, 18. As will still be explained in detail by means of FIGS. 2 and 3 in the text which follows, the multiplexer 19 is designed for combining these parallel data streams Din1, Din2 and to generate from these a single serial digital data stream Din which is available at the output 21 of the multiplexer 19. The data rate of the combined digital data signal Din is greater, typically greater by the factor 2, than the data rate of the digital data streams Din1, Din2, of the data channels 17, 18. The digital/analog converter 20 is connected to the output 21 of the multiplexer 19. The digital data stream Din thus combined in the multiplexer 19 is converted in the digital/analog converter 20 into an analog output signal Dout which can be picked up at the output 16 of the digital/analog converter 20 and thus the digital/analog converter arrangement 13.

In the case of binary coded data input signals, the corresponding current switches of the downstream digital/analog converter 20 are typically also designed for a binary activation. In this case, the multiplexer 19 can be constructed, for example, in a scaled manner.

To control the digital multiplexer 19, the digital/analog converter arrangement 13 also has a control device 22. The control device 22 generates at its output end control signals C1-C4 via which the multiplexer 19 is activated and via which the various data streams Din1, Din2 of the data channels 17, 18 are combined. Typically, a clock generator 23 is also provided which generates a clock signal CLK for the control device 22.

In the present exemplary embodiment, the clock generator 23 and the control device 22 have been shown as part of the digital/analog converter arrangement 13. Naturally, these elements 22, 23 can also be arranged outside the digital/analog converter arrangement 13 and be, for example, part of a program-controlled device as typically exists in conventional communication systems.

Figure 3:
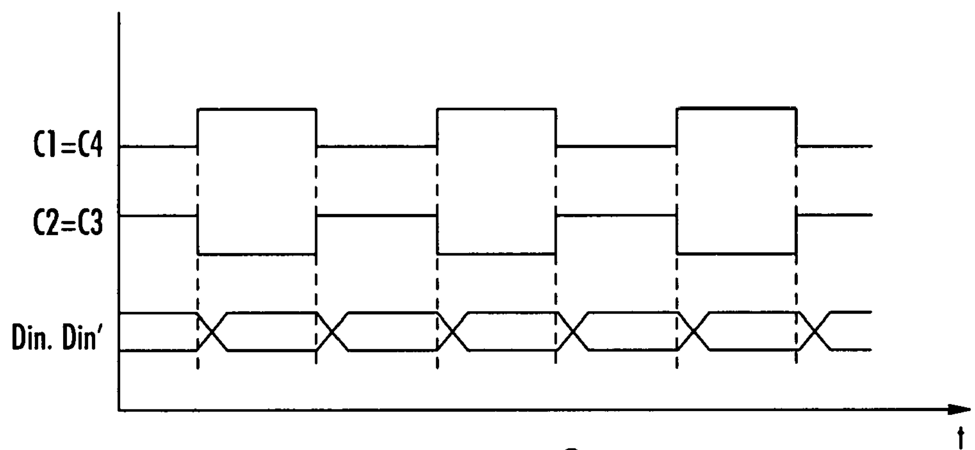
FIG. 3 are signal/time diagrams for the control signals for activating the switching elements of the multiplexer and the output signals of the multiplexer.

In the text which follows, the operation of the digital/analog converter arrangement 13 according to the invention and, in particular, of the digital multiplexer 19 will be explained in greater detail with reference to the circuit arrangement in FIG. 2 and the signal/time diagrams in FIG. 3.

Figure 2:
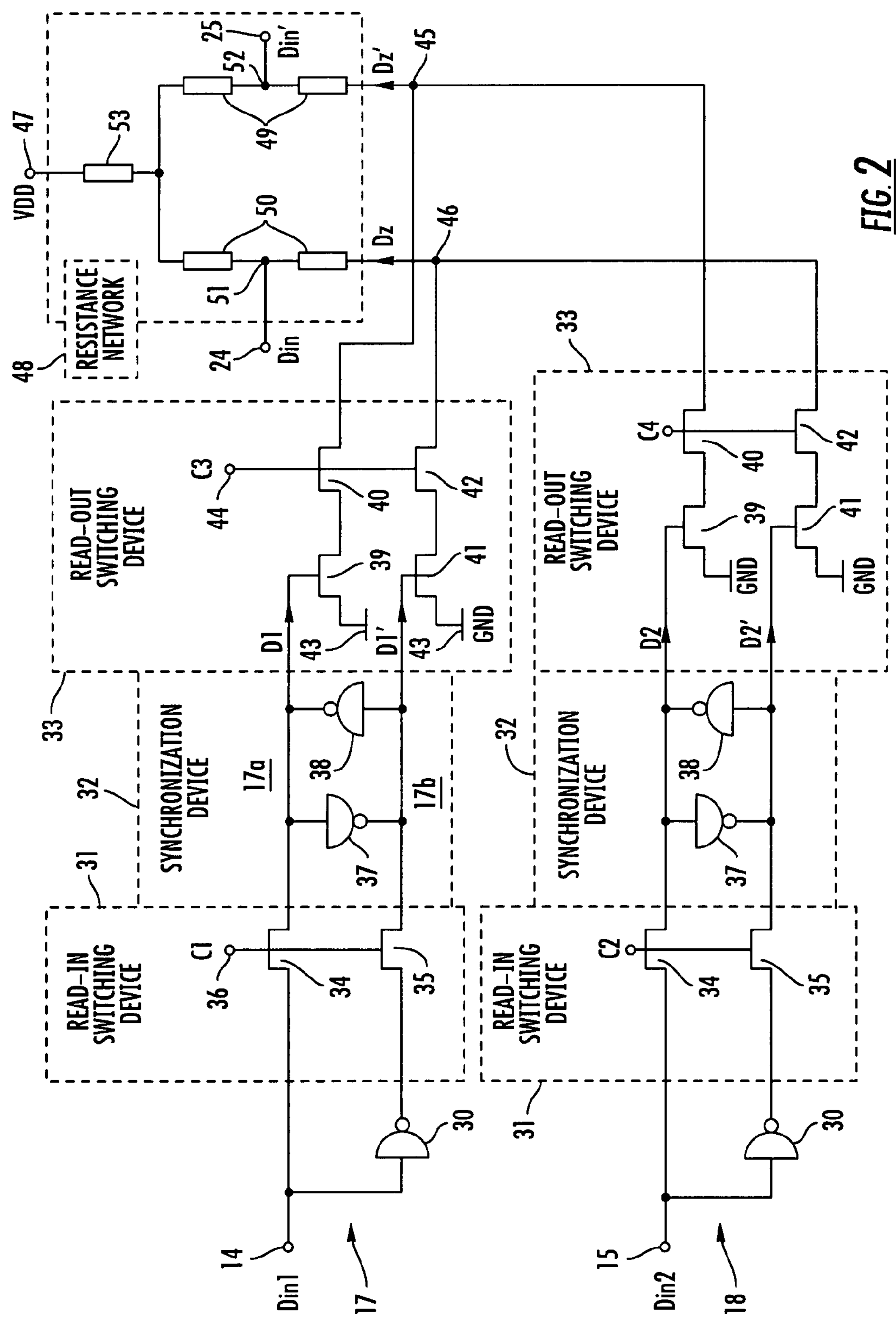
FIG. 2 is an exemplary embodiment of a multiplexer for the digital/analog converter arrangement shown in FIG. 1.

FIG. 2 shows a preferred exemplary embodiment of a multiplexer which can be used in the digital/analog converter arrangement according to the invention in FIG. 1. The digital multiplexer 19 is connected at its input to the two data inputs 14, 15. The multiplexer 19 also has two data outputs 24, 25, at which the data signals Din1, Din2 coupled in via the two data paths 17, 18 are output in combined form. At the data output 24, the combined data signal Din can be picked up. In addition, a further differential data output 25 is provided via which the data signal Din' inverted therefor can be output.

For the sake of better illustration, the multiplexer 19 in the example in FIG. 2 has been shown as a one-bit multiplexer, that is to say each of the data channels 17, 18 is designed for accommodating, processing and forwarding in each case one bit. In general, however, the invention is related to an n-bit multiplexer in which thus each data channel 17, 18 has a number of n individual data channels and is designed for accommodating, processing and forwarding n-bits of the corresponding data source in parallel. The circuit design of such an n-bit multiplexer provides that the multiplexer circuit as shown, for example in FIG. 2, is multiplied correspondingly in accordance with the number n of bits.

The data channels 17, 18 shown in FIG. 2 are continued in the multiplexer 19 and are only combined immediately preceding its data outputs 24, 25. In the present exemplary embodiment, it shall be assumed that the two data channels 17, 18 and the elements arranged therein are arranged in the same manner in both data channels 17, 18. In the text which follows, only data channel 17 is used by way of example for the description even though data channel 18 is arranged in the same manner.

The data channel 17 has two differential data paths 17*a*, 17*b* both of which are connected at the input end to the data input 14 and which are in each case coupled to one of the outputs 24, 25 at the output end. One of the data paths, the lower data path 17*b* in each case in the present exemplary embodiment, has an inverter 30 connected to the data input 14 at the input end. The data signals D1, D1', which are thus inverted with respect to one another, can be forwarded and combined via the two data paths 17*a*, 17*b* so that differential data signals Dz, Dz', that is to say data streams with mutually inverted signal form can be picked up at the two outputs 24, 25.

The data channel 17 has a read-in switching device 31, a synchronization device 32 and a read-out switching device 33. The devices 31, 32, 33 are used for preprocessing and timing the data signals D1, D1'; D2, D2' forwarded in the various data channels 17, 18.

The read-in switching device 31 has two controllable switches 34, 35. The two controllable switches 34, 35 in each case have the same control connection 36 at which a control signal C1 can be applied. By means of the controllable switches 34, 35, which are arranged with their controlled path in the respective data path 17*a*, 17*b*, the latter can be interrupted. The input switching device 31, is followed by the synchronization device 32. The synchronization device is here constructed as a simple latch and contains two inverters 37, 38 which are connected in antiparallel with respect to one another and which are arranged between the two data paths 17*a*, 17*b*. The synchronization device 32 is followed by the read-out switching device 33. The read-out switching device 33 has for each data path 17*a*, 17*b* in each case two controllable switches 39-42, the controlled paths of which are arranged in series in the respective data path 17*a*, 17*b* and with respect to one another. The first controllable switches 39, 41 are connected to the output of the synchronization device 32 and can thus be opened and closed via the information stored in the latch 32. The two controllable switches 40, 42 of the series circuits are connected at the control end to a common control connection 44 via which they can be opened and closed by means of a control signal C3.

The series circuits of the two controllable switches 39, 40; 41, 42 of a respective data path 17*a*, 17*b* are connected, on the one hand, to a first supply connection 43. At this supply connection 43, a first supply potential is present, for example the potential of reference ground GND. At the output end, these series circuits are in each case connected to a common node 44, 45. At the common nodes 44, 45, the various data channels 17, 18 and the data input signals D1, D1'; D2, D2', forwarded in the data channels 17, 18 are combined to form a digital intermediate signal Dz, Dz'. Functionally, the controllable switches 40, 42 and the common nodes 45, 46 form the actual part of the multiplexer since the forwarded data signals D1, D1'; D2, D2' of the two data channels 17, 18 are combined there controlled via the control signals C3, C4.

The controllable switches 34, 35; 39-42 can be constructed as conventional MOSFETs or JFETs. This is particularly advantageous, particularly when the digital/analog converter arrangement 13 according to the invention is arranged in CMOS technology, since this allows fast switching times to be guaranteed.

Between the two common nodes 45, 46 and a second supply connection 47, a device for level conversion 48 is provided. In the present exemplary embodiment, the device for level conversion 48 is constructed as a resistance network 48. The resistance network 48 has for each data path a resistive voltage divider 49, 50, the center taps 51, 52 of which are in each case connected to one of the outputs 24, 25. The two voltage dividers 49, 50, which in each case have two of the resistors arranged in series with one another here are arranged in parallel with one another and connected to a second supply connection 47 via a further resistor 53. The second supply connection 47 has a second supply potential VDD, for example a positive potential.

The two output connections 24, 25 are typically connected directly to corresponding differential data inputs of the downstream digital/analog converter 20. This digital/analog converter 20 generates the analog output signal Dout from the differential data signals Din, Din' present at the connections 24, 25. For this purpose, the digital/analog converter 20 has current or voltage switches, not shown in the drawing, at the input end which are activated via the combined digital data signals Din, Din' and provide in dependence thereon an analog output current or an analog output voltage from which the analog output signal Dout is generated.

In the text which follows, the operation of the multiplexer arrangement 19, shown in FIG. 2, will be explained in greater detail with reference to the signal/time diagram in FIG. 3:

The data signals Din1, Din2 are read into the multiplexer 19 via the read-in switching devices 31 by means of the control signals C1, C2. The two control signals C1, C2 are synchronized with one another and typically inverted with respect to one another. By closing the two controllable switches 34, 35 by means of the control signals C1, C2, a respective data bit of the data signals Din1, Din2 can be read, clock-controlled via the control signals C1, C2, into the latch of the synchronization device 32 and stored there. After a respective data bit 32 has been read into the synchronization device, the controllable switches 34, 35 are opened again via the control signals C1, C2. Typically, but not necessarily, the controllable switches 40, 42 of the read-out switching device 33 are closed simultaneously thereto via the control signals C3, C4. The control signals C3, C4 are synchronous to the control signals C1, C2 and are inverted with respect to one another. The reading-out of the data stored in the synchronization device 32 is controlled via the control signals C3, C4 in that the second controllable switches 40, 42 are opened. The first controllable switches 39, 41 are opened via the information stored in the latch 42. In this manner, the common nodes 45, 46 are connected to the supply voltage (VDD-GND) and the digital intermediate signals Dz, Dz' are generated synchronously to the clock of the control signals C3, C4. Thus, the outputs 24, 25 of the multiplexer 19 are activated.

Typically, but not necessarily, it holds true that the two clock signals C1, C4 and the two clock signals C2, C3 are in each case identical. This is of advantage, particularly for reducing the expenditure for activation, which is also apparent in a significant reduction of the circuit arrangement of the activating circuit 22, 23 of the multiplexer 19.

On each data path 17*a*, 17*b*, the latch of the synchronization device 32 is loaded via a control clock signal C1, C2 and read out again out of the latch 32 of the synchronization device 32 with the next clock of the control clock signal C3, C4 and provided via the common nodes 45, 46 to the outputs 24, 25. To provide the correct switching level of the data signals Din, Din' present at the outputs 24, 25, the resistance network 48 is provided. This resistance network 48 provides for any differential signal deviation ("swing") and can be suitably adjusted in a simple manner through the choice of suitable resistance values of the resistance network 48.

The activation of the controllable switches 34, 35 by means of the control signals C1, C2 is less critical for the operation of the digital multiplexer 19 than it is when the controllable switches 40, 42 are activated via the control signals C3, C4 since the latter two control signals C3, C4 can have a direct influence on the signal quality of combined digital intermediate signals Dz, Dz', which are present at the common nodes 45, 46.

Although the present invention has been described above by means of a preferred exemplary embodiment, it shall not be restricted to this but can be modified in many ways without deviating from the concept of the invention.

Thus, in the present exemplary embodiment, the digital/analog converter arrangement having exactly two data channels has always been assumed.

Actually, this number is understood to be only exemplary and the digital/analog converter arrangement can also be constructed for any greater number of data channels. For this purpose, it is only necessary to correspondingly modify the multiplexer and, in particular, the activation of the data channels.

In addition, naturally, the digital/analog converter arrangement, apart from its use in a communication system or a memory system, is also of advantage for any other applications in which a very high volume of data must be converted with high data quality within the shortest time.

Naturally, any device for level conversion can be provided instead of a resistance network, for example by means of switch transistors or the like. In a minimal variant, it can also be omitted.

As well, the control signals for activating the controllable switches do not necessarily need to be identical but can also be different from one another. In addition, the respective control signals of a respective data channel do not necessarily have to be clock-synchronized to one another but can also be constructed to be asynchronous with respect to one another.

In the entire patent application, a digital signal is understood to be a signal which has logical, that is to say digital information. A logical "0" or "1" respectively, does not necessarily have to have a 0-volt level or a VDD level. Instead, it only means that a logical level ("0") should be lower than the other logical level ("1").

Although in the exemplary embodiment in FIG. 2, the multiplexer shown there is shown for n=1 bit, the invention shall not be restricted to this but can be extended to a corresponding number of bits by correspondingly multiplying the circuit arrangement for a multiplexer described there.

What is claimed is:

1. A multi-channel high-speed digital/analog converter arrangement, comprising:

at least two data channels for receiving and forwarding a corresponding number of digital data input signals comprising respective time characteristics, wherein each one of said data channels is connected to a different data source and wherein each of the data channels is designed to receive a corresponding data input signal comprising respective time characteristics from a data source assigned to the corresponding data channel and to forward this data input signal;

a digital multiplexer generating a digital intermediate signal present at a common node by combining said at least two digital data input signals; said multiplexer comprising a tuning device for tuning said time characteristics of said at least two digital data input signals in respect to each other; and a digital/analog converter connected downstream of said multiplexer for converting said digital intermediate signal into an analog output signal.

2. The arrangement of claim 1, wherein said tuning device comprises a synchronization device for synchronizing said forwarded digital data input signals in respect to each other by means of clock-synchronous control signals.

3. The arrangement of claim 2, wherein said synchronization device comprises a latch.

4. The arrangement of claim 3, wherein said tuning device comprises, at its output, a controllable output switching device which is connected downstream of said latch and which is used for reading out clock-synchronously said forwarded digital data input signals from said latch.

5. The arrangement of claim 4, wherein said output switching device comprises at least one controllable switch per data channel, said controllable switch comprising a controlled path being arranged on a data path of one of said data channels and being able to be activated via a control signal.

6. The arrangement of claim 3, comprising a controllable input switching device connected upstream of said latch and being used for clock-controlled reading of said data input signals into said latch.

7. The arrangement of claim 6, wherein said input switching device comprises at least one controllable switch per data channel, said controllable switch comprising a controlled path being arranged on a data path of one of said data channels and being able to be activated via a control signal.

8. The arrangement of claim 1, wherein at least one of said multiplexer or said digital/analog converter is constructed to be fully differential.

9. The arrangement of claim 1, comprising a device for level conversion arranged between an output of said multiplexer and said common node; said device for level conversion being designed for specifying predetermined logic levels of said intermediate signal.

10. The arrangement of claim 9, wherein said device for level conversion is constructed as a resistance network.

11. The arrangement of claim 1, wherein said digital/analog converter comprises current switches at an input of said digital/analog converter; said current switches being connected directly to an output of multiplexer at the control end.

12. A multi-channel digital/analog converter arrangement, comprising:

at least two data channels for receiving and forwarding a corresponding number of digital data input signals comprising respective time characteristics;

a digital multiplexer generating a digital intermediate signal present at a common node by combining said at least two digital data input signals; said multiplexer comprising a tuning device for tuning said time characteristics of said at least two digital data input signals in respect to each other; and a digital/analog converter connected downstream of said multiplexer for converting said digital intermediate signal into an analog output signal, wherein said tuning device comprises a synchronization device for synchronizing said forwarded digital data input signals in respect to each other by means of clock-synchronous control signals, wherein said tuning device further comprises, at its output, a controllable output switching device which is connected downstream of said synchronization device and which is used for reading out clock-synchronously said forwarded digital data input signals from said synchronization device.

13. A multi-channel digital/analog converter arrangement, comprising:

at least two data channels for receiving and forwarding a corresponding number of digital data input signals comprising respective time characteristics;

a digital multiplexer generating a digital intermediate signal present at a common node by combining said at least two digital data input signals; said multiplexer comprising a tuning device for tuning said time characteristics of said at least two digital data input signals in respect to each other; and a digital/analog converter connected downstream of said multiplexer for converting said digital intermediate signal into an analog output signal, wherein a device for level conversion arranged between an output of said multiplexer and said common node is provided; said device for level conversion being designed for specifying predetermined logic levels of said intermediate signal.

14. A multi-channel digital/analog converter arrangement, comprising:

at least two data channels for receiving and forwarding a corresponding number of digital data input signals comprising respective time characteristics;

a digital multiplexer generating a digital intermediate signal present at a common node by combining said at least two digital data input signals; said multiplexer comprising a tuning device for tuning said time characteristics of said at least two digital data input signals in respect to each other; and a digital/analog converter connected downstream of said multiplexer for converting said digital intermediate signal into an analog output signal, wherein said digital/analog converter comprises current switches at an input of said digital/analog converter; said current switches being connected directly to an output of multiplexer at the control end.

* * * * *